April 2, 1968 J. J. AGUIRRE 3,376,534

VARIABLE INDUCTANCE

Filed May 5, 1966

INVENTOR
JAMES J. AGUIRRE

BY Mason, Albright & Stansbury
ATTORNEYS

United States Patent Office 3,376,534

Patented Apr. 2, 1968

3,376,534

VARIABLE INDUCTANCE

James J. Aguirre, 5819 W. Patterson Ave., Chicago, Ill. 60634

Filed May 5, 1966, Ser. No. 547,891

10 Claims. (Cl. 336—136)

ABSTRACT OF THE DISCLOSURE

In variable tuners having axially moving slugs inside tubular coil forms, internal ribs on the central apertures of the slugs which are received in corresponding grooves of tuning rods prevent jamming that is prevalent in slugs and tuning rods having polygonal and other similar cross-sectional shapes.

This invention relates to a jam-resistant variable inductance and more particularly to a relatively inexpensive variable inductor with improved reliability.

Electronic devices such as television, include a large number of components, the breakdown of any of which may seriously affect the operability of the device. Accordingly, it is important that each component have a high degree of reliability. On the other hand, economy considerations often dictate that the individual components be comparatively inexpensive to manufacture. One such component is the inductance tuner wherein by varying the position of a ferrite slug in a coil the effective permeability of the inductor's core is changed to vary the resonance frequency of a tuned circuit. With conventional tuners of this type, the tuning slug is prone to jam with respect to its tuning rod or shaft so that the structure which retains the tuning rod in axial relation position to the coil is broken and replacement of the entire component becomes necessary. This is caused by the corners of the tuning rod which has a hexagon cross-section, being forced against the walls of the hexagon shaped aperture in the slug, which receives the tuning rod, with sufficient force to bind the shaft to the slug. The problem is aggravated in that the tuning coil may have to operate at temperatures approaching and sometimes exceeding 100° C.

It is an object of this invention to provide an improved variable inductance which is reasonably economical to produce and at the same time is more reliable than conventional devices of the same type in that its tuning rod is less likely to bind to the tuning slug. Other objects, adaptabilities and capabilities will appear as the description progresses, reference being had to the accompanying drawings, in which.

Figure 1:
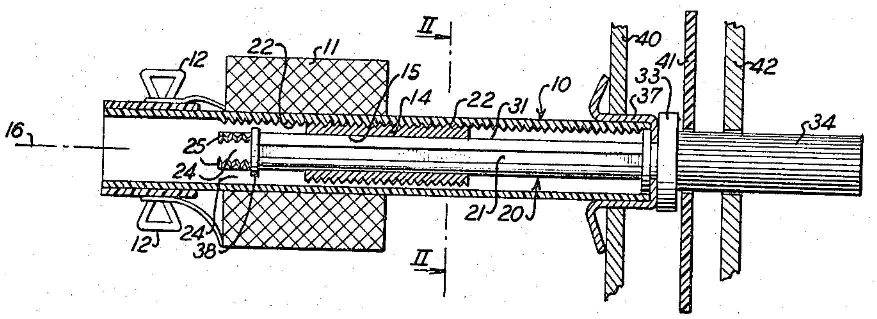
FIGURE 1 is a side view in partial section of the variable inductance assembly mounted on a chassis.
Figure 2:
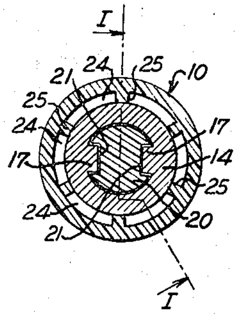
FIGURE 2 is a sectional view taken on lines II—II of FIGURE 1.
Figure 3:
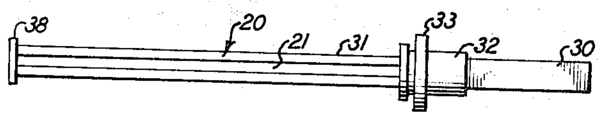
FIGURE 3 is a detail view of the tuning rod.

Referring now to FIGURE 1, it will be noted that an internally threaded tubular member 10 carries a coil 11 of electrically conductive material such as copper wire with leads to electrical connections 12. The tubular member 10 is composed of an insulating plastic material, preferably a thermoplastic resin having physical characteristics which enable it to withstand temperatures up to at least 105° C. A slug 14 of ferrous material, generally ferrite, is externally threaded to correspond to the internal threads of the tubular member 10. A longitudinally disposed opening 15 extends through the axis of rotation 16 of the slug 14. It will be noted that the slug includes a pair of ribs 17 (see FIGURE 2) disposed oppositely to each other about the axis of rotation 16 and extending within the opening 15 parallel to its axis of rotation 16. Also received within the opening 15 is a tuning rod 20 (see FIGURE 3) which includes a pair of oppositely disposed grooves 21 in an otherwise circular cross section. The grooves 21 are adapted to receive the ribs 17 so that when the slug 14 turns in the internal threads of the tubular member 10, the slug 14 moves longitudinally along the rod 20. In FIGURE 2 it will be noted that area for the internal threads 22 of the tubular means 10 includes a number of parallel grooved areas 24 whereby six threaded portions 25 disposed sixty degrees apart about the interior of the tubular member 10 are provided. This construction permits circulation of air through the grooved areas 24 and about the slug 14 which is thereby able to dissipate heat more readily, maintain a more nearly constant temperature, and be less likely to cause overheating of the internal threading of the tubular member 10. Additionally, with this structure the internal threads may be more easily threaded by the application of the slug 14, if desired.

Figure 4:
FIGURE 4 is a cross sectional view of the end portion of the tuning rod as taken on lines IV—IV of FIGURE 3.
Figure 6:
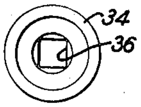
FIGURES 5 and 6 are side and views respectively of the control cap which fits over the end portion of the tuning rod.
Figure 5:
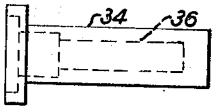

The tuning rod 20, like the tubular means 10, is composed of an insulating plastic material, preferably a thermoplastic resin capable of withstanding temperatures up to 105° C. It includes an end portion 30 which, as shown in FIGURE 4, has the cross section of a polygon which in the embodiment disclosed is a square. Between the end portion 30 and the forward grooved portion 31 of the tuning rod 20 are a pair of cylindrical portions 32 and 33. A control cap 34 is press fitted over the end portion 30 and the cylindrical portions 32 and 33 so as to provide a light torque. It will be noted from FIGURES 5 and 6 that the internal bore 36 of the control cap 34 corresponds to the shape of the end portion 30 and the cylindrical portion 32.

A tube fastener 37 is rotatably secured to the tuning rod 20 next to the cylindrical portion 33 and is adapted to grasp the tubular member 10 tightly whereby the tuning rod 20 and the tubular member 10 are maintained in fixed longitudinal position as shown in FIGURE 1. The tube fastener 37 also functions to attach the unit as a whole to a chassis 40. An insulating washer 41 may be provided around the control cap 34 and between the cylindrical portion 33 in a cabinet 42, if desired.

The tuning rod 20 fits somewhat loosely within the opening 15 so as to preclude binding and to permit the slug 14 to move smoothly along the tuning rod 20 as the tuning rod 20 is rotated relative to the tubular member 10. The grooves 21 may, if desired, have the configuration of grooves **21*a* (see FIGURES 7 and 8). It will be noted that the grooves 21 and the ribs 17 are generally of rectangular cross sections whereas the grooves 21 (and thus the corresponding ribs) are trapezoidal in cross section so that the opposing sides of the grooves and ribs extend toward the axis of rotation 16 of the slug 14. The loose splined type of cooperation between the tuning rod 20 and the slug 14** is of particular importance since lubrication is impracticable in a device of this nature.

After the slug 14 has been inserted on the tuning rod 20 a stop 38 is produced at the end thereof by applying heat to same so that the size is increased by melting of the plastic in this area.

Figure 7:
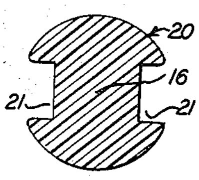
FIGURES 7 and 8 show alternative cross sections of the tuning rod.
Figure 8:
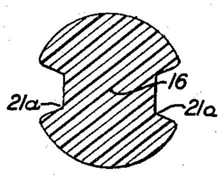

With rotational force being transferred from a tuning rod to a tuning slug by the configuration illustrated in FIGURES 2, 7 and 8, none of the edges or corners of the rod can bind against the slug. It will be recognized by those skilled in the art that it is within the scope of this invention to provide ribs on a tuning rod and cooperating grooves on a tuning slug and to utilize various numbers of ribs and grooves other than the sets of two illustrated in the figures. Other desirable materials for the construction of the tubular member 10 and tuning rod 20 are thermosetting resins and resin impregnated paper based material.

While I have described the preferred embodiment of my invention, it is to be understood that it is capable of other adaptations and modifications within the scope of the appended claims.

Having thus described my invention, what I claim as new and desire to secure by Letters Patent is:

1. A variable inductance which comprises tubular means composed of an insulating plastic material, said tubular means threaded internally, a coil of electrically conductive material encircling said tubular means, a ferrous slug received within said tubular means, said slug being threaded externally to match the internal threads of said tubular means, a longitudinally disposed opening through the axis of rotation of said slug, said slug including a rib extending into said opening parallel to the axis of rotation of said slug, a tuning rod composed of an insulating plastic material received in said opening, said tuning rod turnable relative to said tubular member and including a groove receiving said rib whereby said slug turns with said rod and moves longitudinally thereon.

2. A variable inductance in accordance with claim 1 wherein said rib is of trapezoidal cross section.

3. A variable inductance in accordance with claim 2 wherein the opposing sides of said rib extend toward the axis of rotation of said slug.

4. A variable inductance in accordance with claim 2 wherein a further rib extends into said opening which is oppositely disposed with respect to said first mentioned rib and said rod includes a further groove receiving said rib.

5. A variable inductance in accordance with claim 1 wherein the internal threads of said tubular means are grooved longitudinally whereby the contact of the threads of said slug with the threads of said tubular means is substantially reduced.

6. A variable inductance in accordance with claim 1 wherein a portion of said rod extending out of said tubular means includes a portion which is of polygonal cross section, a control cap tightly receiving said portion.

7. A variable inductance in accordance with claim 1 wherein said turning rod is turnably secured to said tubular means.

8. A variable inductance in accordance with claim 1 wherein said core is composed of ferrite.

9. A variable inductance in accordance with claim 1 wherein said tubular means and said rod are composed of the thermoplastic resin.

10. A variable inductance in accordance with claim 1 wherein the end of said rod includes a stop member comprising an enlarged plastic portion.

References Cited

UNITED STATES PATENTS

| | | | |
|---|---|---|---|
| 2,509,193 | 5/1950 | Temple | 336—136 |
| 2,540,863 | 2/1951 | Carlson | 336—136 |
| 2,869,088 | 1/1959 | Cushman | 336—136 X |
| 3,105,213 | 9/1963 | Richard et al. | 74—424.8 X |
| 3,155,895 | 11/1964 | Adams et al. | 336—136 X |
| 3,177,730 | 4/1965 | Sangen et al. | 336—136 X |
| 3,259,862 | 7/1966 | Richard | 336—136 |

DARRELL L. CLAY, *Primary Examiner.*

L. H. MYERS, *Examiner.*

T. J. KOZMA, *Assistant Examiner.*